US010215787B2

(12) United States Patent
Tajima et al.

(10) Patent No.: US 10,215,787 B2
(45) Date of Patent: Feb. 26, 2019

(54) RADIO WAVE MEASUREMENT DEVICE HAVING A LARGE APERTURE

(71) Applicant: INTER-UNIVERSITY RESEARCH INSTITUTE CORPORATION, Tsubaki-shi, Ibaraki (JP)

(72) Inventors: Osamu Tajima, Tsubaki (JP); Shugo Oguri, Tsubaki (JP)

(73) Assignees: INTER-UNIVERSITY RESEARCH INSTITUTE CORPORATION, Tsukuba-shi (JP); HIGH ENERGY ACCELERATOR RESEARCH ORGANIZATION, Tsukuba-shi (JP)

( * ) Notice: Subject to any disclaimer, the term of this patent is extended or adjusted under 35 U.S.C. 154(b) by 476 days.

(21) Appl. No.: 14/957,151

(22) Filed: Dec. 2, 2015

(65) Prior Publication Data

US 2016/0091545 A1   Mar. 31, 2016

Related U.S. Application Data

(63) Continuation of application No. PCT/JP2014/064208, filed on May 29, 2014.

(30) Foreign Application Priority Data

Jun. 3, 2013  (JP) ................................ 2013-116571

(51) Int. Cl.
  *G01R 27/04*  (2006.01)
  *G01R 27/32*  (2006.01)
  (Continued)

(52) U.S. Cl.
  CPC ......... *G01R 27/32* (2013.01); *G01R 29/0878* (2013.01); *B64G 1/105* (2013.01);
  (Continued)

(58) Field of Classification Search
  CPC .......... G01S 3/02; G01S 13/86; G01S 13/867; G01S 13/90; G01S 5/02; G01S 7/026;
  (Continued)

(56) References Cited

U.S. PATENT DOCUMENTS

| 5,841,067 A * | 11/1998 | Nakamura | ........... H05K 9/0045 |
| | | | 174/382 |
| 2009/0015491 A1 * | 1/2009 | Ikeda | ........................ G01J 5/08 |
| | | | 343/703 |
| 2012/0130649 A1 * | 5/2012 | Salerno | .............. G01N 21/0303 |
| | | | 702/23 |

FOREIGN PATENT DOCUMENTS

| JP | 60-163475 A | 8/1985 |
| JP | 2003-23362 A | 1/2003 |

(Continued)

OTHER PUBLICATIONS

International Search Report dated Nov. 4, 2014, issued in corresponding application No. PCT/JP2014/064208.

*Primary Examiner* — Vinh Nguyen
(74) *Attorney, Agent, or Firm* — Westerman, Hattori, Daniels & Adrian, LLP

(57) ABSTRACT

A radio wave measurement device enabling highly sensitive measurements of radio waves at an extremely low temperature is disclosed. The radio wave measurement device has a radiation-blocking filter through which a targeted radio wave is transmitted, a radio wave-transparent material to reflect a non-targeted electromagnetic wave included in radio waves, and a radio wave detector which are placed in a vacuum vessel, in which the radio waves are transmitted through the radiation-blocking filter, the non-targeted electromagnetic wave included in the radio waves is reflected toward the radiation-blocking filter by the radio wave-transparent material and collected as heat into the radiation-blocking filter, and the heat is exhausted out of the system, (Continued)

allowing the radio waves transmitted through the radio wave-transparent material to be measured with high sensitivity by the radio wave detector.

2 Claims, 7 Drawing Sheets

(51) Int. Cl.
*G01R 29/08* (2006.01)
*G02B 5/20* (2006.01)
*B64G 1/10* (2006.01)

(52) U.S. Cl.
CPC ...... *B64G 2001/1042* (2013.01); *G02B 5/208* (2013.01); *H01L 2924/0002* (2013.01)

(58) Field of Classification Search
CPC ...... G01S 13/42; G01S 2007/027; G01S 7/41; G01C 21/00; G01R 29/0878; G01R 29/12; G01R 27/32; G01R 29/0857; G01R 31/3651; G01R 31/3679; G01R 31/3682; G01R 31/3689; G05B 15/02; H01L 2924/0002; H01L 2924/00; G02B 5/208; H04B 1/3827
See application file for complete search history.

(56) References Cited

FOREIGN PATENT DOCUMENTS

| | | |
|---|---|---|
| JP | 2006-211626 A | 8/2006 |
| JP | 2008-145289 A | 6/2008 |
| JP | 2013-96968 A | 5/2013 |

* cited by examiner

[Fig. 1]
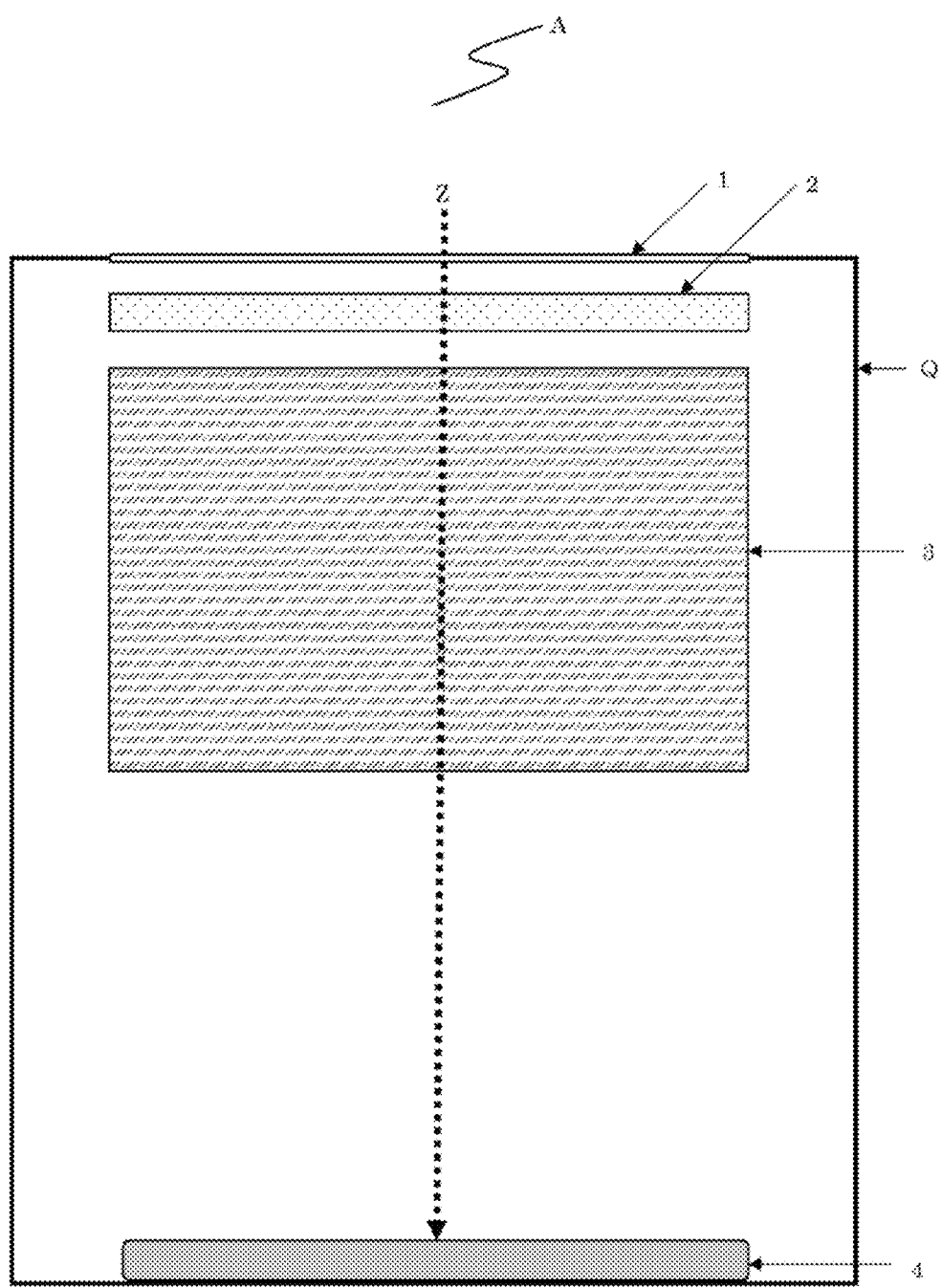

[Fig. 2]
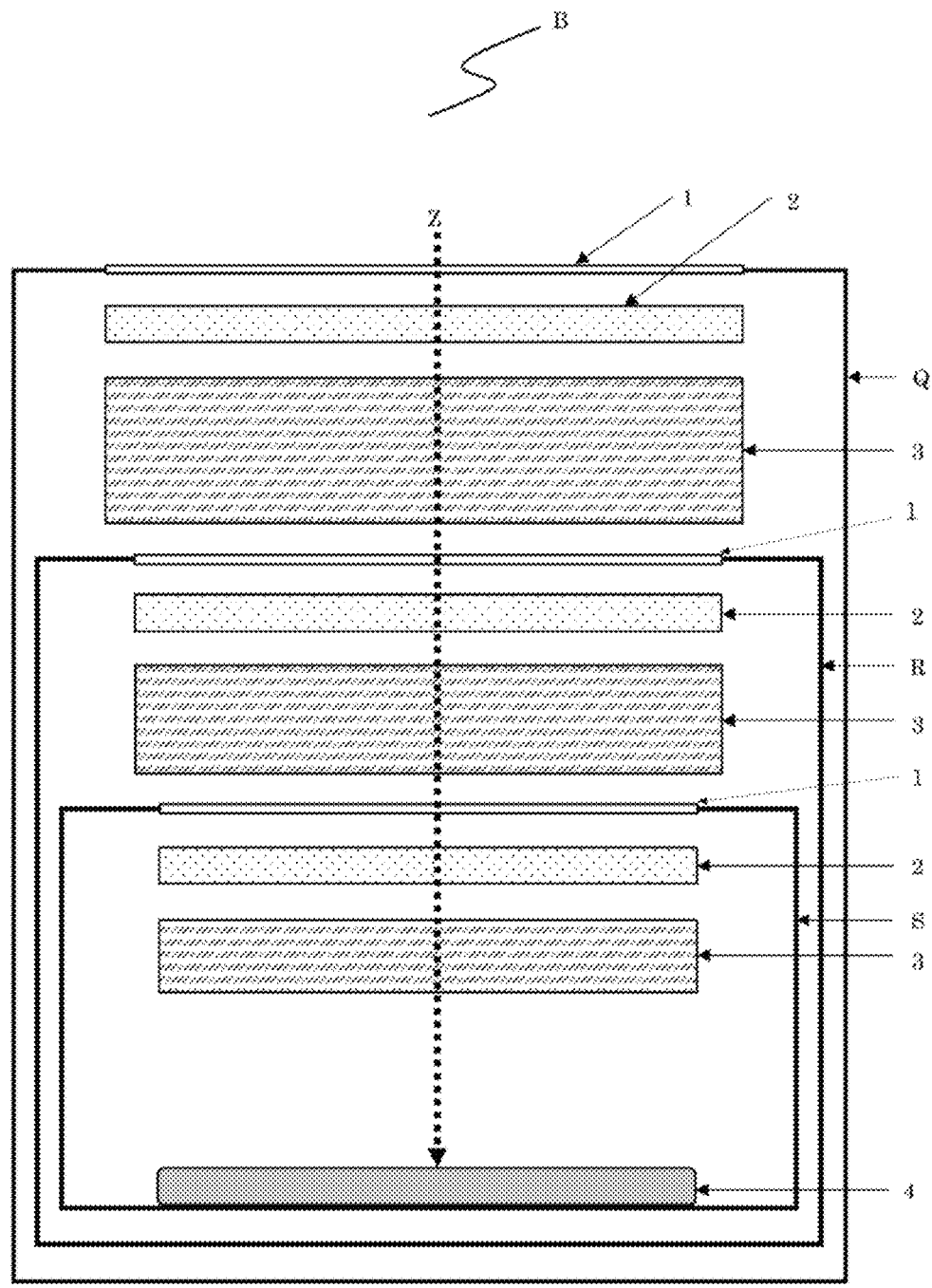

[Fig. 3]
(A)
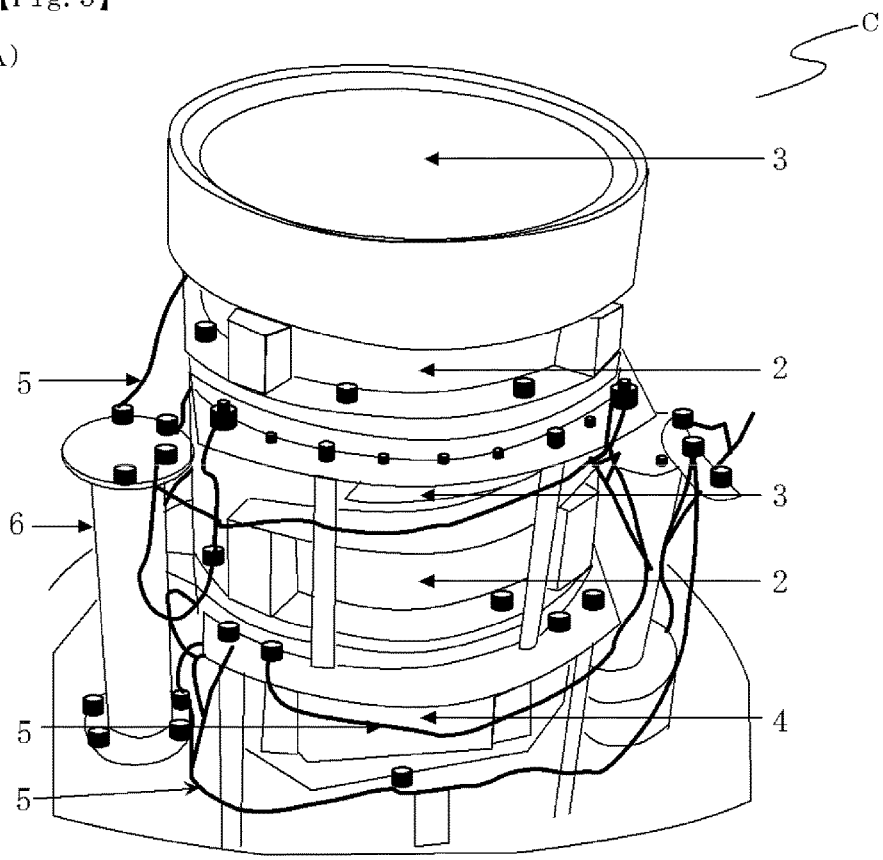
(B)
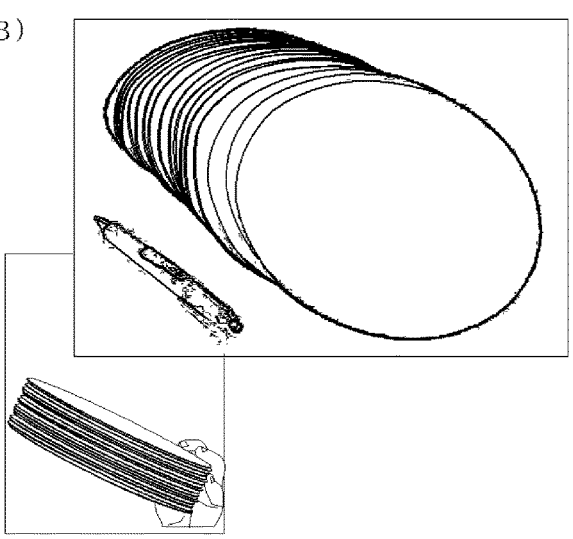

[Fig. 4]
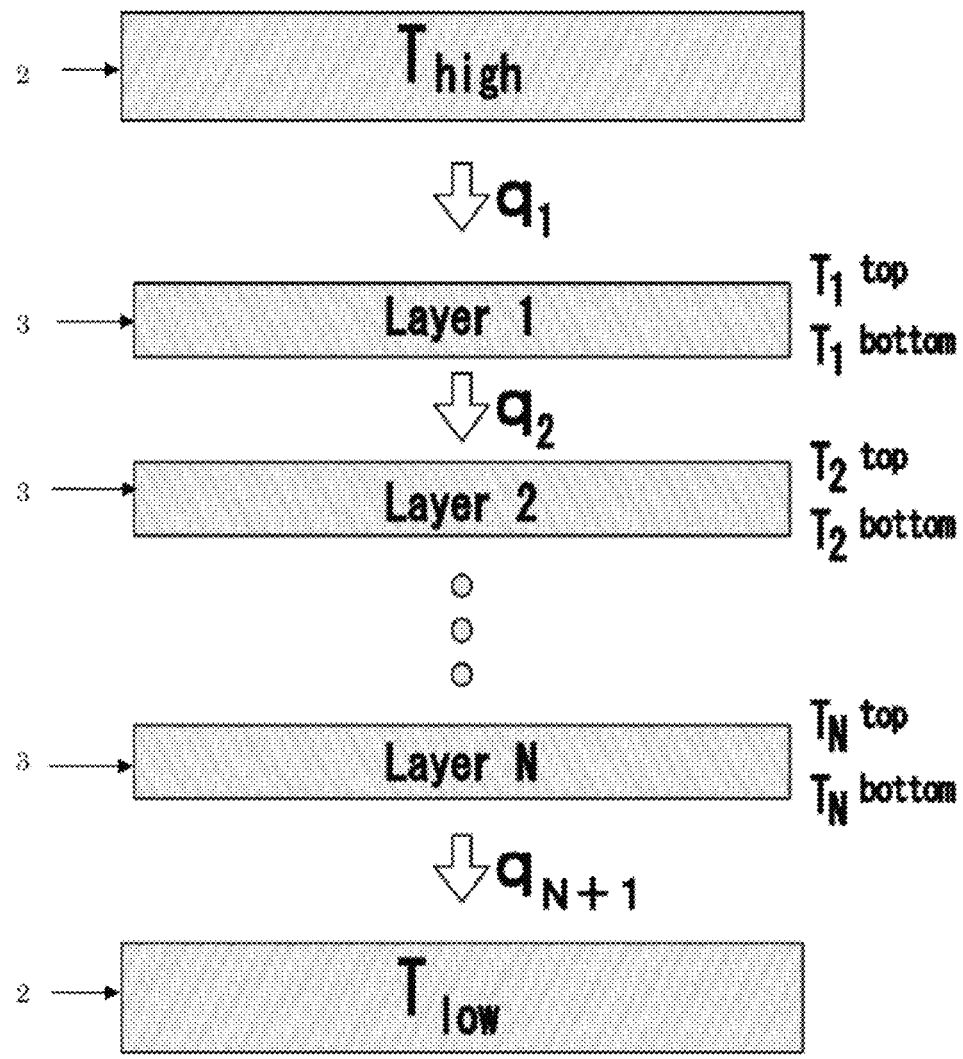
$$q_{N+1} \leq \frac{q1}{N+1}$$

[Fig. 5]
Graph A
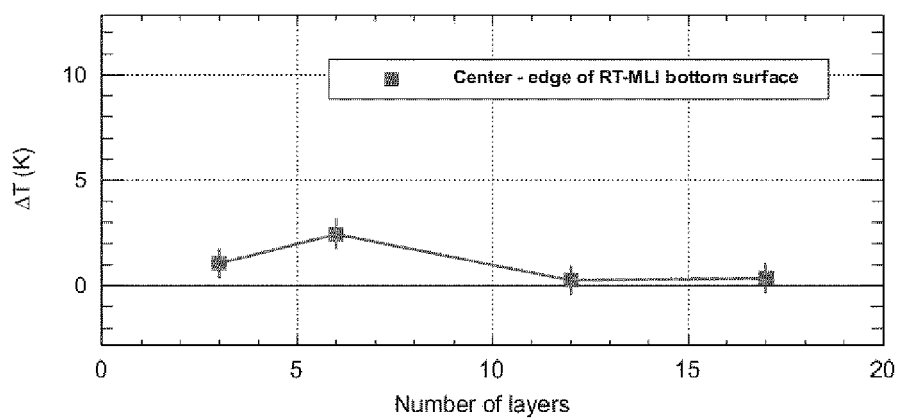
Graph B
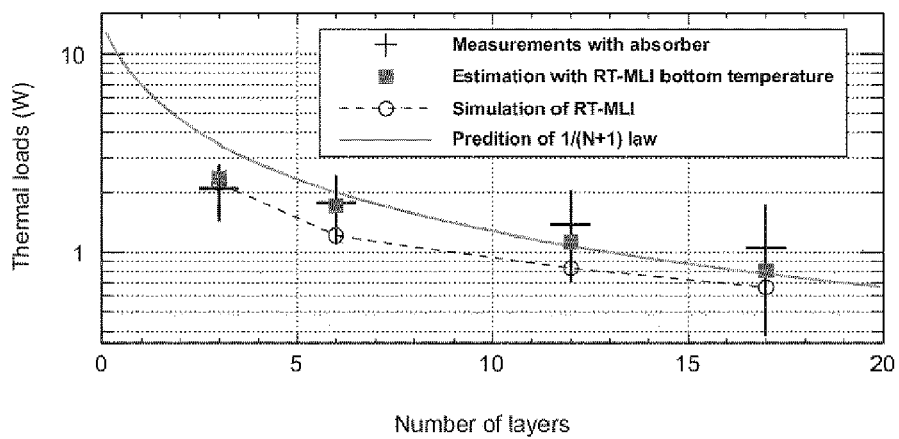

[Fig. 6]
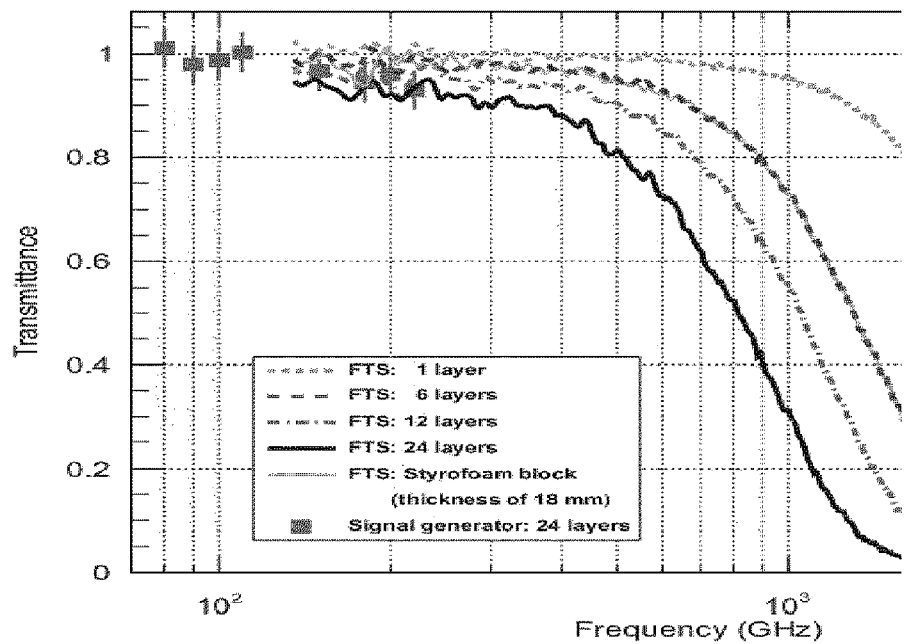

[Fig. 7]

TABLE 1

|  | MEASURED VALUE |
|---|---|
| SURFACE TEMPERATURE OF RADIO WAVE DETECTOR IN THIRD RADIATION SHIELD | 8.2 K |
| TEMPERATURE OF SECOND STAGE GM COOLER | 8.0 K |
| TEMPERATURE OF FIRST STAGE GM COOLER | 29.6 K |

RADIO WAVE MEASUREMENT DEVICE HAVING A LARGE APERTURE

TECHNICAL FIELD

The present invention relates to a radio wave measurement device. More specifically, the present invention relates to a radio wave measurement device having a large aperture which enables highly sensitive measurements of radio waves at an extremely low temperature.

BACKGROUND ART

It is known that a radio wave detector used for a 45 mm radio telescope is placed within a vacuum chamber which is cooled to a temperature of about 20 K.

Patent Literature 1 discloses a configuration having a cooling window material which has an enlarged diameter of at least 170 mm together with characteristics of efficiently absorbing thermal infrared rays, improving thermal conductivity, improving transparency in a sub millimeter area and reducing a reflection loss, an extremely low temperature cooling apparatus for an astronomical observation device including the window material, and examination equipment utilizing terahertz wave observation. As for the window material, Patent Literature 1 discloses a configuration in which an electrical wave introduction window 13 of a cooling container 11 includes a cooling window material 14 in which a monocrystal sapphire substrate is used as a base material, a cut face is formed as a C plane, and a thick anti-reflection film of silicon oxide (SiOx) is formed on a surface of the sapphire substrate. However, this methodology is effective for external thermal insulation, but provides no description and no suggestion regarding means for exhausting heat radiated in the cooling container from electromagnetic waves passing through the cooling window material.

Patent Literature 2 discloses a system in which a body to be tested is placed within a vacuum chamber of a Dewar flask structure and the vacuum chamber is cooled to an extremely low temperature. However, this methodology is effective for the external thermal insulation, but provides no description and no suggestion regarding means for exhausting heat radiated in the vacuum chamber.

Patent Literature 3 discloses a cryogenic container in which nested vacuum chambers are provided and each chamber has a multi-layer radiation shield plate on an inner wall surface thereof, and the innermost chamber is filled with a refrigerant within which a superconductive winding is placed. However, this methodology is effective for the external thermal insulation, but provides no description and no suggestion regarding means for exhausting heat radiated in the cooling container.

Generally, a filter is practically provided to a window serving to take in radio waves for astronomical observation. Examples of the filter used include an optical glass filter or plastic filter such as an ultraviolet filter, a visible light filter, an infrared filter and the like.

Absorption heat of the filter is generally exhausted by a refrigerating machine and the like. If a refrigerating machine is used in a radio wave detector having a large aperture, cooling of the filter disadvantageously loads on the refrigerating machine. Since the optical glass filter and the plastic filter have a large refractive index and reflect a part of the radio waves in nature, the thicker the filter is, the less the radio waves are transmitted therethrough. Therefore, electromagnetic waves such as ultraviolet rays, visible light rays, infrared rays, far infrared rays and the like are transmitted through the filter of the window to some degree. The optical glass filter and the plastic filter need to be subjected to antireflective treatment, and the antireflective treatment requires high technology.

Sensitivity of a radio wave measuring instrument improves in proportion to an opening area of a window for radio wave incident, but then again, window aperture enlargement is very difficult because the window aperture enlargement involves increase in heat intrusion.

In order to enhance radio wave detection sensitivity, it is very effective to enlarge the aperture of the window of the vacuum vessel through which the radio waves come in and go out. Moreover, it may be considered to be desirable that, in order to exhaust the heat in the vacuum vessel, a material having high radio wave transparent characteristics and high thermal insulation characteristics be provided within the vacuum vessel, but there are almost no reports of such devices.

As described above, in the radio wave measurement device having the radio wave detector placed within a vacuum low temperature vessel, the low temperature vessel is kept at a low temperature by a thermal insulation material, but the thermal insulation principle is similar to the principle of a vacuum multi-layer insulation (MLI) used in a general refrigerating machine, that is, a thermal insulation principle using radiative equilibrium, and therefore, the MLI is provided along the wall of the low temperature vessel so as to surround the low temperature vessel. However, this methodology has a problem in that the extremely low temperature is hard achieved since the heat radiated in the vacuum low temperature vessel is not sufficiently exhausted. However, an effective means for solving this problem has not been reported in the past.

The radio wave measurement device is used as, for example, a radio wave measurement device for a radiometer. A radiometer is disclosed in, for example, Patent Literature 4.

Patent Literature 4 discloses that radio wave detection is performed at room temperature, but provides no description and no suggestion regarding placing radio wave detector at a low temperature. Patent Literature 4 discloses only cooling means of immersing a black body in liquid nitrogen for calibrating a temperature.

CITATION LIST

Patent Literature

Patent Literature 1: Japanese Patent Laid-Open No. 2006-211626
Patent Literature 2: Japanese Patent No. 3833671
Patent Literature 3: Japanese Patent Laid-Open No. 60-163475
Patent Literature 4: EP-B1-00667518

SUMMARY OF INVENTION

Technical Problem

As described above, the radio wave measurement device is used as, for example, a radio wave measurement device for an astronomical telescope, a radio wave measurement device for a radiometer, a radio wave measurement device for a weather satellite, a radio wave measurement device for an exploration satellite, a radio wave measurement device for radar, and the like. These radio wave measurement devices determine a temperature of a subject to be measured based on intensity measurement of the radio waves radiated by the subject to be measured such as an astronomical body, the sky, an object, a material, and the like. Improved sensitivity of the radio wave measurement is required for every radio wave measurement device. For example, highly sensitive measurements of cosmic background radiation by astronomical telescopes contribute to tracing the origin of the universe. The highly sensitive measurements of radio waves by radiometers contribute to rapid prediction and prevention of natural disasters. The highly sensitive measurements of radio waves by weather satellites contribute to rapid prediction of a weather changes and prevention of natural disasters. The highly sensitive measurements of radio waves by exploration satellites contribute to, for example, new discoveries of underground resources. The highly sensitive measurements of radio waves by radar contribute to high-speed moving body tracing.

The radio waves entering, through the window of the radio wave measurement device, the vessel in which the radio wave detector is placed include targeted radio waves and non-targeted electromagnetic waves as well. There are in the electromagnetic waves in the natural world the radio waves of 3 THz or less, defined under the Japanese Radio Act, mixed with gamma rays, X-rays, ultraviolet rays, visible light rays, infrared rays, and far infrared rays. In the present invention, the gamma rays, X-rays, the ultraviolet rays, the visible light rays, the infrared rays, and the far infrared rays are non-targeted electromagnetic waves, and are noise for measurements of the targeted radio waves. Therefore, the measurements of the targeted radio waves with high sensitivity need to remove the non-targeted electromagnetic waves before the radio wave measuring instrument. Of the non-targeted electromagnetic waves, the ultraviolet rays, the visible light rays, the infrared rays, and the far infrared rays are thermal radiation sources likely to be absorbed by a material of $10^{-2}$ eV or more, and are large noises unless the heat is exhausted outside a measurement system. On the other hand, since the radio waves are small energy of $10^{-2}$ eV or less, cutting the electromagnetic wave noises is essential to the radio wave measurements. Therefore, the ideal radio wave measurements are to measure, by the radio wave detector placed at an absolute zero temperature, only the targeted radio waves with the non-targeted electromagnetic waves being completely cut. However, as described above, the radio wave measurements of related art have performed the radio wave measurements at a low temperature using equipment in which the radio wave detector is merely placed within the vacuum vessel or within the low temperature vessel. For this reason, the radio wave measurements at a low temperature have an effect that causes radiant heat of the radio wave detector itself to move to a cooling source, but the electromagnetic waves as the thermal radiation source included in the radio waves are not removed, and therefore, an effect of thermal radiation of the electromagnetic waves has made the highly sensitive measurements by the radio wave detector difficult.

In consideration of the above conditions, an object of the present invention is to provide a radio wave measurement device which enables to measure the radio waves with sensitivity ten or more times higher than that of related art.

Solution to Problem

In order to achieve the above object, the present inventor and the like have eagerly studied, and, as a result, have found new means in which, of the radio waves entering the vacuum vessel, the targeted radio waves are transmitted through, the non-targeted electromagnetic waves included in the transmitted radio waves are reflected, and the reflection is collected as heat to be efficiently exhausted (named an electromagnetic wave vacuum reflection thermal insulation method), accomplishing the present invention based on this knowledge.

That is, the present invention provides:

1.

A radio wave measurement device configured to include a vacuum vessel (first radiation shield) enabling cooling and having a window through which a radio wave is allowed to enter, a radiation-blocking filter disposed beneath the window, a radio wave-transparent material disposed beneath the radiation-blocking filter, and a radio wave detector disposed beneath the radio wave-transparent material within the first radiation shield, in which a targeted radio wave included in radio waves incident through the window is transmitted by the radiation-blocking filter, subsequently, a non-targeted electromagnetic wave included in the transmitted radio waves is reflected toward the radiation-blocking filter by the radio wave-transparent material and collected as heat into the radiation-blocking filter, and then the heat is exhausted out of the system via thermal conduction of the radiation-blocking filter, which allows the radio waves transmitted through the radio wave-transparent material to be measured with high sensitivity by the radio wave detector.

2.

The radio wave measurement device according to description 1 above, including the first radiation shield, nested radiation shields each having a structure the same as and a size different from the first radiation shield inside the first radiation shield, and the radio wave detector placed within the last radiation shield, in which a targeted radio wave included in radio waves incident through the window is transmitted by each radiation-blocking filter of the radiation shield group, subsequently, a non-targeted electromagnetic wave included in the transmitted radio waves is reflected toward the radiation-blocking filter by each radio wave-transparent material of the radiation shield group and collected as heat into each radiation-blocking filter of the radiation shield group, and then the heat is exhausted out of the system via thermal conduction of each radiation-blocking filter, which allows the radio waves transmitted through each radio wave-transparent material of the radiation shield group to be measured with high sensitivity by the radio wave detector placed within the last radiation shield.

3.

The radio wave measurement device according to description 1 or 2 above, configured to be used for a radio wave measurement device for an astronomical telescope.

4.

The radio wave measurement device according to description 1 or 2 above, configured to be used for a radio wave measurement device for a radiometer.

5.

The radio wave measurement device according to description 1 or 2 above, configured to be used for a radio wave measurement device for a weather satellite.

6.

The radio wave measurement device according to description 1 or 2 above, configured to be used for a radio wave measurement device for an exploration satellite.

7.

The radio wave measurement device according to description 1 or 2 above, configured to be used for a radio wave measurement device for radar.

Advantageous Effects of Invention

The present invention has the above described configuration, exerting the following effect. That is:
1. The present invention has the vacuum vessel enabling cooling in which the targeted radio waves are transmitted through the radiation-blocking filter, the non-targeted electromagnetic waves included in the transmitted radio waves are reflected toward the radiation-blocking filter by the radio wave-transparent material disposed beneath the radiation-blocking filter and are collected as heat into the radiation-blocking filter, and the heat can be exhausted out of the system via the thermal conduction of the radiation-blocking filter, efficiently allowing a temperature inside the vacuum vessel to reach an extremely low temperature. As a result, cooling load can be reduced to one tenth or lower of that of related art, and the radio wave measurements with the large aperture can be performed with high sensitivity.
2. As the radio wave-transparent material, the radio wave-transparent material which reflects a large amount of the ultraviolet rays, the visible light, the infrared rays and the far infrared rays, and has high thermal insulation properties can be used, reducing the noise due to the thermal radiative electromagnetic waves as well as keeping temperature inside the vacuum vessel at an extremely low temperature. As a result, the measurements with sensitivity ten or more times higher than that of related art are enabled.
3. As the radio wave-transparent material used in the present invention, a material obtained by stacking two or more sheets of radio wave-transparent material is preferably used.
4. A heat quantity Hr per unit time in terms of converting the electromagnetic wave to be reflected into heat, as an indicator for reflective performance which the radio wave-transparent material has, is usually 1 MJ/m$^2$ or more. Here, m$^2$ expresses a unit plane area of the radio wave-transparent material.
5. As another indicator for electromagnetic wave reflectivity of the radio wave-transparent material, a transmittance of the radio wave in a targeted frequency range and a transmittance of the electromagnetic wave in a non-targeted frequency range can be provided. For example, for the radio wave measurements used for the radio telescope, the radiometer, the weather satellite, the exploration satellite, and the radar, the transmittance of the radio wave of 400 GHz or less in the frequency range is 90% or more and the transmittance of the electromagnetic wave of 1 THz or more is 95% or less.
6. The electromagnetic wave reflectivity of the radio wave-transparent material may be sufficient so long as either the above description 4 or 5 is satisfied.
7. As the radio wave-transparent material, a foamed resin material is preferable. Since the foamed resin material has a high radio wave transparency of transmitting the targeted radio waves and property of reflecting the non-targeted electromagnetic wave, even if the window is subjected to the aperture enlargement, no additional load is put on the refrigerating machine.
8. The present invention may be usable as many radio wave measurement devices such as a radio wave measurement device for an astronomical telescope, a radio wave measurement device for a radiometer, a radio wave measurement device for a weather satellite, a radio wave measurement device for an exploration satellite, a radio wave measurement device for radar, and the like.

BRIEF DESCRIPTION OF DRAWINGS

FIG. 1 is a schematic view illustrating a radio wave measurement device according to Claim 1.

FIG. 2 is a schematic view illustrating a radio wave measurement device according to Claim 2.

FIG. 3 is a photograph illustration explaining a radio wave measurement device according to the present invention. A photograph (A) is a full view photograph illustration of the radio wave measurement device according to the present invention. A photograph (B) is a photograph illustration of stacked foamed polystyrene resin sheets.

FIG. 4 is a schematic view illustrating an arrangement of a radiation-blocking filter and a radio wave-transparent material, and thermal radiation performed with this arrangement.

FIG. 5 is graphs and a table illustrating experimental results obtained by a cooling test. Graph A shows a temperature difference between a center portion and an edge portion on a bottom surface of the radio wave-transparent material in a third radiation shield. Graph B shows a relationship between the number of stacked layers of the radio wave-transparent material in the third shield and an input heat quantity (W). An RT-MLI is one of the radio wave-transparent materials (radio-transparent multi-layer insulator).

FIG. 6 is a graph illustrating experimental results obtained by a cooling test. A graph C shows a relationship between the number of stacked layers of the radio wave-transparent material and a radio wave transmittance.

FIG. 7 shows Table 1 showing a temperature of a surface of the radio wave detector in the third radiation shield when twelve sheets (one sheet having a thickness of 3 mm) of foamed polystyrene resin (trade name: Styrofoam, registered trademark of Dow Chemical Company) are stacked as the radio wave-transparent material in a first radiation shield, and five sheets of the same material are stacked in a second radiation shield. For comparison, a temperature of a first stage GM cooler and a temperature of a second stage GM cooler are shown.

DESCRIPTION OF EMBODIMENTS

The present invention is based on the "electromagnetic wave vacuum reflection thermal insulation method", a new technical idea. The "electromagnetic wave vacuum reflection thermal insulation method" refers to thermal insulation (blocking heat intrusion) in which, without blocking a radio wave passing through a vacuum space, the radio wave being included in the electromagnetic wave entering the vacuum space, a thermal radiative electromagnetic wave included in the electromagnetic wave is reflected to a direction opposite to a travelling direction of the electromagnetic wave in a course of the radio wave passing due to the radio wave-transparent material being intervened. The present invention does not relate to directly cooling and exhausting the heat absorbed by the thermal insulation material unlike the related art. The present invention does not need to aggressively cool the heat. Cooling in the present invention can be covered by only cooling a vacuum vessel to a predetermined temperature. Time needed to cool the vacuum vessel to a predetermined temperature can be significantly reduced as compared to the related art.

The window refers to an opening provided to the vacuum vessel for the electromagnetic wave to come in and go out. The window is not specifically limited so long as it is made of a material transmitting the targeted radio wave and resisting a vacuum pressure. Examples of this material include, for example, polyethylene resin material, polypropylene resin material, polystyrene resin material, polyethylene terephthalate resin material, polytetrafluoroethylene resin material, acrylic resin material, polycarbonate resin material, and foamed resin material of these materials.

The electromagnetic waves refer to electromagnetic waves in which the radio waves of 3 THz or less, defined under the Japanese Radio Act, are mixed with gamma rays, X-rays, ultraviolet rays, visible light rays, infrared rays, and far infrared rays.

The radio waves refer to radio waves of 3 THz or less, defined under the Japanese Radio Act. The present invention can transmit, of the radio waves of 3 THz or less, a radio wave in a specific frequency region for any purpose. For example, for the radio wave measurements for the radio telescope, radiometer, weather observation satellite, exploration satellite, and radar, the radio waves of 400 GHz or less can be transmitted with the transmittance of 90% or more.

The reflection includes contribution of both the thermal radiation in a reflection direction and mirrorlike reflection. A degree of reflection depends on the radio wave-transparent material.

A reflection amount of the electromagnetic waves by the radio wave-transparent material becomes larger, as the number (N) of sheets of radio wave-transparent material increases, and when incident electromagnetic waves having a heat conversion quantity $q_1$ pass through N sheets of radio wave-transparent material, a heat conversion quantity $q_{N+1}$ of the electromagnetic waves is $q_{N+1} \leq q_1/N+1$.

The radiation-blocking filter refers to a filter blocking radiation of the electromagnetic wave included in the radio waves to transmit the radio waves. This radiation-blocking filter can transmit the targeted radio waves. As the radiation-blocking filter, a filter suitable to transmit the targeted radio waves can be adequately selected. For example, a plastic material is suitable to transmit the radio waves of 3 THz or less, defined under the Japanese Radio Act. The foamed resin material may also be used for the plastic material. The plastic material may have a metal mesh interposed therein. Examples of the foamed resin include, for example, a polyethylene resin, polypropylene resin, polystyrene resin, polyethylene terephthalate resin, polytetrafluoroethylene resin, acrylic resin, polycarbonate resin and the like. The window may have a foamed resin radiation-blocking filter inserted therein. Moreover, the radio wave-transparent material may be disposed immediately under the window. This prevents dew condensation on the window, generating a secondary effect.

The radio wave-transparent material refers to a material for blocking the electromagnetic wave included in the radio waves passing through the radiation-blocking filter to transmit the radio waves. The radio wave-transparent material can reflect the non-targeted electromagnetic waves and transmit the targeted radio waves. As the radio wave-transparent material, a material may be adequately selected which is suitable to reflect the non-targeted electromagnetic waves and transmit the targeted radio waves.

A heat transfer quantity Ht per unit time of the radiation-blocking filter and a heat conversion radiation quantity Hr for an hour of the electromagnetic waves reflected by the radio wave-transparent material are usually adjusted such that Ht≥Hr holds. Hr is usually 1 MJ/m² or more. A unit of m² expresses a unit plane area of the radiation-blocking filter and radio wave-transparent material. This Hr refers to an amount of solar radiation for one hour, as a reference. The amount of solar radiation for one hour in Japan is 1 MJ/m² to 4 MJ/m².

As another indicator for electromagnetic wave reflectivity of the radio wave-transparent material, a transmittance of the radio wave in a targeted frequency range and a transmittance the electromagnetic wave in a non-targeted frequency range can be provided. For example, for the radio wave measurements using the radio telescope, the radiometer, the weather satellite, the exploration satellite, and the radar, the transmittance of the radio wave of 400 GHz or less in the frequency range is 90% or more and the transmittance of the electromagnetic wave of 1 THz or more is 95% or less.

As the radio wave-transparent material, a material obtained by stacking two or more sheets of radio wave-transparent material is preferably used. Stacking of the sheets forms a clearance to further improve a thermal insulation effect, and thus, the refractive index is comparable with an air, which omits necessity of an antireflective treatment. Since a laminated body of the radio wave-transparent material does not involve large increase in a cooling load, the cooling load is not so increased even if the window is subjected to aperture enlargement.

As the radio wave-transparent material, the foamed resin material is preferable. The foamed resin material has a high thermal insulation property and a high radio wave transparency. Stacking of this foamed resin material (referring to sheet, film or the like) forms a clearance to further improve the thermal insulation effect, and thus, the refractive index is comparable with an air, which omits necessity of the antireflective treatment. Since use of a laminated body of the foamed resin material does not involve large increase in a cooling load, the cooling load is not so increased even if the window is subjected to aperture enlargement. As described later, the radio wave-transparent material made using the foamed resin is excellent in characteristics of reflecting the electromagnetic wave, and from this regard, it can be considered that a film structure of the foamed resin material has an effect.

As the foamed resin material, there can be cited resin materials containing foams including a foamed polystyrene resin material, foamed polyethylene resin material, foamed nylon resin material, foamed polypropylene resin material, foamed polytetrafluoroethylene resin material, foamed acrylic resin material, and the like. Among these, the foamed polystyrene resin material is preferable.

A thickness of one sheet of the foamed resin material is preferably about 2 mm to 5 mm. More preferably, the thickness is 2 mm to 3 mm.

As the radio wave-transparent material, there is a usable material other than the foamed resin material. For example, a synthetic fiber, a natural fiber and the like can be cited.

The radiation-blocking filter and the radio wave-transparent material are disposed so as not to be parallel with a travelling direction of an incident electromagnetic wave. A surface of the radiation-blocking filter and a surface of the radio wave-transparent material are usually arranged so as to be vertical to the travelling direction of the electromagnetic wave.

The radio wave detector can detect the radio wave having a frequency of 3 THz or less, defined under the Japanese Radio Act.

The vacuum vessel enabling cooling refers to a vessel enabling cooling and in which vessel a space can be produced in a state where a pressure therein lower than the atmospheric pressure. A degree of vacuum of the vacuum vessel is usually $10^{-1}$ Pa or less, preferably $10^{-3}$ Pa or less, and more preferably $10^{-5}$ Pa or less. The expression "enabling cooling" means enabling cooling by use of a refrigerating machine.

The cooling means moving a heat by use of the heat pump principle. The cooling is performed by use of the refrigerating machine. Of the refrigerating machines, a refrigerant-free refrigerating machine which uses no liquid refrigerant as a cryogen is preferably used in the present invention. Here, the refrigerant-free refrigerating machine refers to a mechanical refrigerating machine which uses a compressor to repeatedly compress and expand a helium gas for cooling. It is also called a GM cooler, and a pulse tube refrigerator. As the refrigerant-free refrigerating machine, a cryogenic refrigerator equipped with a first stage and a second stage is usually used. A temperature to which the vacuum vessel is cooled by the refrigerating machine is preferably an extremely low temperature. Here, the extremely low temperature is usually a temperature of 10 K or less, preferably 4K or less, and more preferably 1 K or less.

The highly sensitive measurements refer to measuring by reducing noises so as to sufficiently enlarge signals relatively to the noises. An indicator for sensitivity variously depends on a measuring device or a subject to be measured through the radio wave measurements.

Hereinafter, with reference to the drawings, an aspect of the present invention is described in detail as Examples (hereinafter, also referred to as "the example") of the present invention. Moreover, the present invention is not limited to the examples, but includes various modifications conceived from the examples, thoughts of the present invention and the Claims.

EXAMPLE 1

FIG. 1 shows a radio wave measurement device A according to Claim 1. A radio wave measurement device A is configured to include a vacuum vessel enabling cooling (first radiation shield) (Q) and having a window (1) through which a radio wave (Z) is allowed to enter, a radiation-blocking filter (2) disposed beneath the window (1), and a radio wave-transparent material (3) disposed beneath the radiation-blocking filter (2), and a radio wave detector (4) disposed beneath the radio wave-transparent material (3) within the first radiation shield (Q), in which a targeted radio wave included in radio waves incident through the window (1) is transmitted by the radiation-blocking filter (2), subsequently, a non-targeted electromagnetic wave included in the transmitted radio waves is reflected toward the radiation-blocking filter (2) by the radio wave-transparent material (3) and collected as heat into the radiation-blocking filter (2), and then the heat is exhausted out of the system via thermal conduction of the radiation-blocking filter (2), which allows the radio waves transmitted through the radio wave-transparent material (3) to be measured with high sensitivity by the radio wave detector (4).

EXAMPLE 2

FIG. 2 shows a radio wave measurement device B according to claim 2. A radio wave measurement device B is configured to include the first shield (Q), nested radiation shields (R, S) each having a structure the same as and a size different from the first radiation shield (Q) inside the first shield (Q), and the radio wave detector (4) placed within the last radiation shield (S), in which a targeted radio wave included in radio waves (Z) incident through the window (1) is transmitted by each radiation-blocking filter (2) of a radiation shield group (Q, R, S), subsequently, a non-targeted electromagnetic wave included in the transmitted radio waves is reflected toward each radiation-blocking filter (2) by each radio wave-transparent material (3) of the radiation shield group (Q, R, S) and collected as heat into the radiation-blocking filters (2) of the radiation shield group (Q, R, S), and then the heat is exhausted out of the system via thermal conduction of each radiation-blocking filter (2), which allows the radio waves transmitted through each radio wave-transparent material (3) of the radiation shield group (Q, R, S) to be measured with high sensitivity by the radio wave detector (4) placed within the last radiation shield (S). The windows of the radiation shields (R, S) nested in the first shield may be omitted in some cases.

The radiation-blocking filters disposed in the first radiation shield and in the respective radiation shields nested in the first radiation shield are usually coupled with the refrigerating machine via a metal wire (not shown in the figure), and the heat collected into the radiation-blocking filter is exhausted.

EXAMPLE 3

FIG. 3 is a photograph illustration of the radio wave measurement device according to the present invention showing an assembly example. A photograph A in FIG. 3 shows a radio wave measurement device C. The radio wave measurement device C has a first radiation shield, a second radiation shield and a third radiation shield. Each radiation shield is behind an external thermal insulation material provided to the device and is not clearly seen. The radio wave measurement device C is formed into a cylindrical shape having a diameter of 508 mm and a height of 480 mm, the radiation-blocking filter (2) is made using high-density polyethylene having a diameter of 260 mm and a thickness of 10 mm, and the radio wave-transparent material (3) is made using a material obtained by stacking foamed polystyrene resin sheets each having a thickness of 2 mm to 3 mm and a diameter of 210 mm. A black body (not shown in the figure) for temperature calibration is placed at a room temperature (about 300 K), and the radio wave detector (4) has a diameter of 200 mm. A metal wire (5) couples the respective radiation-blocking filters (2) of the first radiation shield, second shield and third shield with the refrigerating machine (6). A photograph B in FIG. 3 shows circular plates (17 plates) stacked each having a diameter of 210 mm and a thickness of 3 mm which are cut out and sliced from Styrofoam used as an example of the radio wave-transparent material. Other materials may include a foamed polyethylene resin material, foamed nylon resin material, foamed polypropylene resin material, foamed polytetrafluoroethylene resin material, foamed acrylic resin material and the like (not shown in the figure).

EXAMPLE 4

FIG. 4 is a schematic view illustrating an arrangement of the radiation-blocking filter (2) and the radio wave-transparent material (3), and thermal radiation performed with this arrangement. The number of stacked layers of the radio wave-transparent material is two or more because it preferable to form a clearance. This arrangement allows the radiant heat to be put into an equilibrium condition between the layers. Since the thermal radiative electromagnetic waves are reflected toward the radiation-blocking filter (2) by the radio wave-transparent material (3) of each layer, multi-layered arrangement allows the heat quantity in terms of heat quantity conversion of the intruding electromagnetic waves to be reduced. The more the number of stacked layers of the radio wave-transparent material (3), the less the heat intrusion quantity. If the number of stacked layers of the radio wave-transparent material (3) is set to about ten, the heat intrusion quantity may be reduced to about one tenth. The number of stacked layers may be adequately set as desired. When the number of stacked layers of the radio wave-transparent material (3) is small or a temperature $T_{high}$ of the first radiation-blocking filter (2) is a small value, a greater effect is exerted. This is because a material having small thermal conduction is used as the radio wave-transparent material (3), which leads to a thermal equilibrium condition between both sides of each layer ($T_{top}$, $T_{bottom}$) through the thermal conduction.

EXAMPLE 5

FIG. 5 and FIG. 6 show results of a cooling test carried out using the radio wave measurement device C. A refrigerating machine (GM cooler: RDK-408S, manufactured by Sumitomo Heavy Industries, Ltd.) equipped with a first stage and a second stage was used to carry out the cooling test. A graph A in FIG. 5 shows a temperature difference between a center portion and an edge portion on a bottom surface of the radio wave-transparent material in the third radiation shield. A graph B in FIG. 5 shows a relationship between the number of stacked layers of the radio wave-transparent material and an input heat quantity W. A graph C in FIG. 6 shows a relationship between a radio wave transparency owing to the radio wave-transparent material and the number of stacked layers of the material. A value "1" on an ordinate axis of the graph C represents the transmittance is 100%. Measurement of the radio wave transmittance is carried out by use of two different measuring instruments, a Fourier transform spectrometer and a radio wave signal generator. Table 1 in FIG. 7 shows a temperature of a surface of the radio wave detector in the third radiation shield. An abscissa axis of the graph represents the number of stacked layers of the radio wave-transparent material.

It can be seen from the graph A that there is little temperature difference between the top and bottom surfaces at the center portion and edge portion of the radio wave-transparent material. It can be seen from the graph B that the input heat quantity can be reduced to a small amount of 1 W or less. It can be seen from the graph C that, without deteriorating the radio wave transparency of the radio waves in a targeted frequency range (here, the radio waves of 400 GHz or less) by the radio wave-transparent material, one sheet of radio wave-transparent material can remove about 5% of the electromagnetic waves of 1 THz or more included in the radio waves. Moreover, 90% or more of the electromagnetic waves of 3 THz or more, defined under the Japanese Radio Act, included in the radio waves can be removed (not shown in the figure). Further, it can be seen that the transparency of the targeted radio waves is less affected by the number of stacked layers of radio wave-transparent material. It can be seen from Table 1 that a temperature can be reached to approximately the same temperature as a cooling capability temperature of the cryogenic refrigerator which uses the surface temperature of the radio wave detector in the radiation shield.

The radio wave measurement device configuration according to the present invention can be used for highly sensitive measurements of the radio waves targeted by a radio telescope, and thus, the radio wave measurement device according to the present invention can be used for the radio wave measurement device for a radio telescope.

The radio wave measurement device configuration according to the present invention can be used for highly sensitive measurements of the radio waves targeted by a radiometer, and thus, the radio wave measurement device according to the present invention can be used for the radio wave measurement device for a radiometer.

The radio wave measurement device configuration according to the present invention can be used for highly sensitive measurements of the radio waves targeted by a weather satellite, and thus, the radio wave measurement device according to the present invention can be used for the radio wave measurement device for a weather satellite.

The radio wave measurement device configuration according to the present invention can be used for highly sensitive measurements of the radio waves targeted by an exploration satellite, and thus, the radio wave measurement device according to the present invention can be used for the radio wave measurement device for an exploration satellite.

The radio wave measurement device configuration according to the present invention can be used for highly sensitive measurements of the radio waves targeted by a radar, and thus, the radio wave measurement device according to the present invention can be used for the radio wave measurement device for radar.

The configuration according to the present invention can be used as a terahertz wave measurement device by replacing the radio wave-transparent material with a terahertz frequency range-transparent material. Further, the configuration according to the present invention can be used as an electromagnetic wave measurement device for measuring the electromagnetic waves by replacing the radio wave-transparent material with an electromagnetic wave-transparent material and replacing the radio wave detector with an electromagnetic wave detector for detecting the gamma rays, X-rays, ultraviolet rays, visible light rays, near infrared rays, infrared rays, far infrared rays and the like.

INDUSTRIAL APPLICABILITY

The present invention can be used for a wide variety of industrial equipment such as the radio wave measurement device for a radio telescope, radio wave measurement device for a radiometer, radio wave measurement device for a weather satellite, radio wave measurement device for an exploration satellite, radio wave measurement device for radar and the like.

REFERENCE SIGNS LIST

A radio wave measurement device
B radio wave measurement device
C radio wave measurement device
Q vacuum vessel to be cooled (first radiation shield)
R radiation shield
S radiation shield
Z electromagnetic wave
1 window
2 radiation-blocking filter
3 radio wave-transparent material
4 radio wave detector
5 metal wire
6 refrigerating machine

The invention claimed is:

1. A radio wave measurement device comprising: a vacuum vessel (first radiation shield) enabling cooling and including a window through which a radio wave is allowed to enter, a radiation-blocking filter disposed beneath the window, a radio wave-transparent material disposed beneath the radiation-blocking filter, and a radio wave detector disposed beneath the radio wave-transparent material within the first radiation shield, wherein a targeted radio wave included in radio waves incident through the window is transmitted by the radiation-blocking filter, subsequently, a non-targeted electromagnetic wave included in the transmitted radio waves is reflected toward the radiation-blocking filter by the radio wave-transparent material and collected as heat into the radiation-blocking filter, and then the heat is exhausted out of the system via thermal conduction of the radiation-blocking filter, wherein the radio wave detector is configured to measure the radio waves transmitted through the radio wave-transparent material with high sensitivity, and wherein a transmittance of the targeted radio wave of 400 GHz or less in the frequency range is 90% or more, and a transmittance of the non-targeted electromagnetic wave of 1 THz or more is 95% or less.

2. The radio wave measurement device according to claim 1, comprising: a plurality of nested radiation shields, each of the plurality of nested radiation shields having the same structure as the first radiation shield and having different sizes from the first radiation shield, the plurality of nested radiation shields being disposed inside the first radiation shield, wherein the radio wave detector is disposed beneath the radio wave-transparent material within a last nested radiation shield of the plurality of nested radiation shields, wherein a targeted radio wave included in radio waves incident through the window is transmitted by each radiation-blocking filter of a radiation shield group, the radiation shield group comprising the first radiation shield and the plurality of nested radiation shields, subsequently, a non-targeted electromagnetic wave included in the transmitted radio waves is reflected toward the radiation-blocking filter by each radio wave-transparent material of the radiation shield group and collected as heat into the radiation-blocking filters of the radiation shield group, and then the heat is exhausted out of the system via thermal conduction of each radiation-blocking filter, and wherein the radio wave detector placed within the last nested radiation shield is configured to measure the radio waves transmitted through each radio wave-transparent material of the radiation shield group with high sensitivity.

* * * * *